United States Patent
Kawashima et al.

(10) Patent No.: US 10,079,409 B2
(45) Date of Patent: Sep. 18, 2018

(54) METHOD FOR PRODUCING CELL INCLUDING ELECTROLYTE IMPREGNATION INSPECTION AND PRESSURIZATION

(71) Applicants: Automotive Energy Supply Corporation, Zama-shi, Kanagawa (JP); NISSAN MOTOR CO., LTD., Yokohama-shi, Kanagawa (JP)

(72) Inventors: Asako Kawashima, Zama (JP); Shinichi Tasaki, Yokohama (JP); Chika Amemiya, Yokohama (JP); Daisuke Iga, Chofu (JP); Tomoyuki Nagaoka, Machida (JP); Takeshi Yasooka, Yamoto (JP); Hiroshi Ishikawa, Sagamihara (JP)

(73) Assignees: AUTOMOTIVE ENERGY SUPPLY CORPORATION, Zama-shi (JP); NISSAN MOTOR CO., LTD., Yokohama-shi (JP)

( * ) Notice: Subject to any disclaimer, the term of this patent is extended or adjusted under 35 U.S.C. 154(b) by 151 days.

(21) Appl. No.: 14/904,846

(22) PCT Filed: Jun. 24, 2014

(86) PCT No.: PCT/JP2014/066599
§ 371 (c)(1),
(2) Date: Jan. 13, 2016

(87) PCT Pub. No.: WO2015/008585
PCT Pub. Date: Jan. 22, 2015

(65) Prior Publication Data
US 2016/0172718 A1 Jun. 16, 2016

(30) Foreign Application Priority Data
Jul. 18, 2013 (JP) .................. 2013-149183

(51) Int. Cl.
*H01M 10/04* (2006.01)
*H01M 10/44* (2006.01)
(Continued)

(52) U.S. Cl.
CPC ........ *H01M 10/44* (2013.01); *G01R 31/3627* (2013.01); *H01M 10/04* (2013.01);
(Continued)

(58) Field of Classification Search
CPC ........... H01M 110/446; H01M 110/04; H01M 110/44; H01M 110/049; H01M 110/48;
(Continued)

(56) References Cited

FOREIGN PATENT DOCUMENTS

| JP | 11-329505 A | 11/1999 |
|---|---|---|
| JP | 2002-110252 A | 4/2002 |

(Continued)

OTHER PUBLICATIONS

Narumi, Keisuke, Machine Translation of JP 2004-139961 A, May 2004 (Year: 2004).*

*Primary Examiner* — Sean P Cullen
(74) *Attorney, Agent, or Firm* — Foley & Lardner LLP

(57) ABSTRACT

A method for producing cell 1, which includes cell element 4 wherein positive electrode plate 41 and negative electrode plate 42 are laminated with an interposal of separator 43 therebetween; and outer case 5 which houses cell element 4 together with an electrolyte solution. An electrolyte solution injection step for forming cell 1 by having outer case 5 contain cell element 4 and electrolyte solution (step S1), a charging step for charging cell 1 (step S2), and an impregnation condition inspection step for inspecting an impregnation condition of the electrolyte solution into cell element 4 after charging cell 1 are conducted in the order of the electrolyte solution injection step, the charging step and the impregnation condition inspection step.

10 Claims, 6 Drawing Sheets

(51) Int. Cl.
  *H01M 10/48* (2006.01)
  *H01M 10/52* (2006.01)
  *G01R 31/36* (2006.01)
  *H01M 10/0525* (2010.01)
  *H01M 10/0566* (2010.01)
  *H01M 10/0585* (2010.01)
  *H01M 10/42* (2006.01)

(52) U.S. Cl.
  CPC ....... *H01M 10/049* (2013.01); *H01M 10/446* (2013.01); *H01M 10/48* (2013.01); *H01M 10/52* (2013.01); H01M 10/0404 (2013.01); H01M 10/0525 (2013.01); H01M 10/0566 (2013.01); H01M 10/0585 (2013.01); H01M 10/4285 (2013.01)

(58) Field of Classification Search
  CPC .. H01M 110/52; H01M 10/446; H01M 10/04; H01M 10/44; H01M 10/049; H01M 10/48; H01M 10/52; G01R 31/3627
  USPC .......................................................... 29/623.1
  See application file for complete search history.

(56) References Cited

FOREIGN PATENT DOCUMENTS

| | | |
|---|---|---|
| JP | 2004-139961 A | 5/2004 |
| JP | 2010-135186 A | 6/2010 |
| JP | 2010-181290 A | 8/2010 |
| JP | 2012-28290 A | 2/2012 |

\* cited by examiner

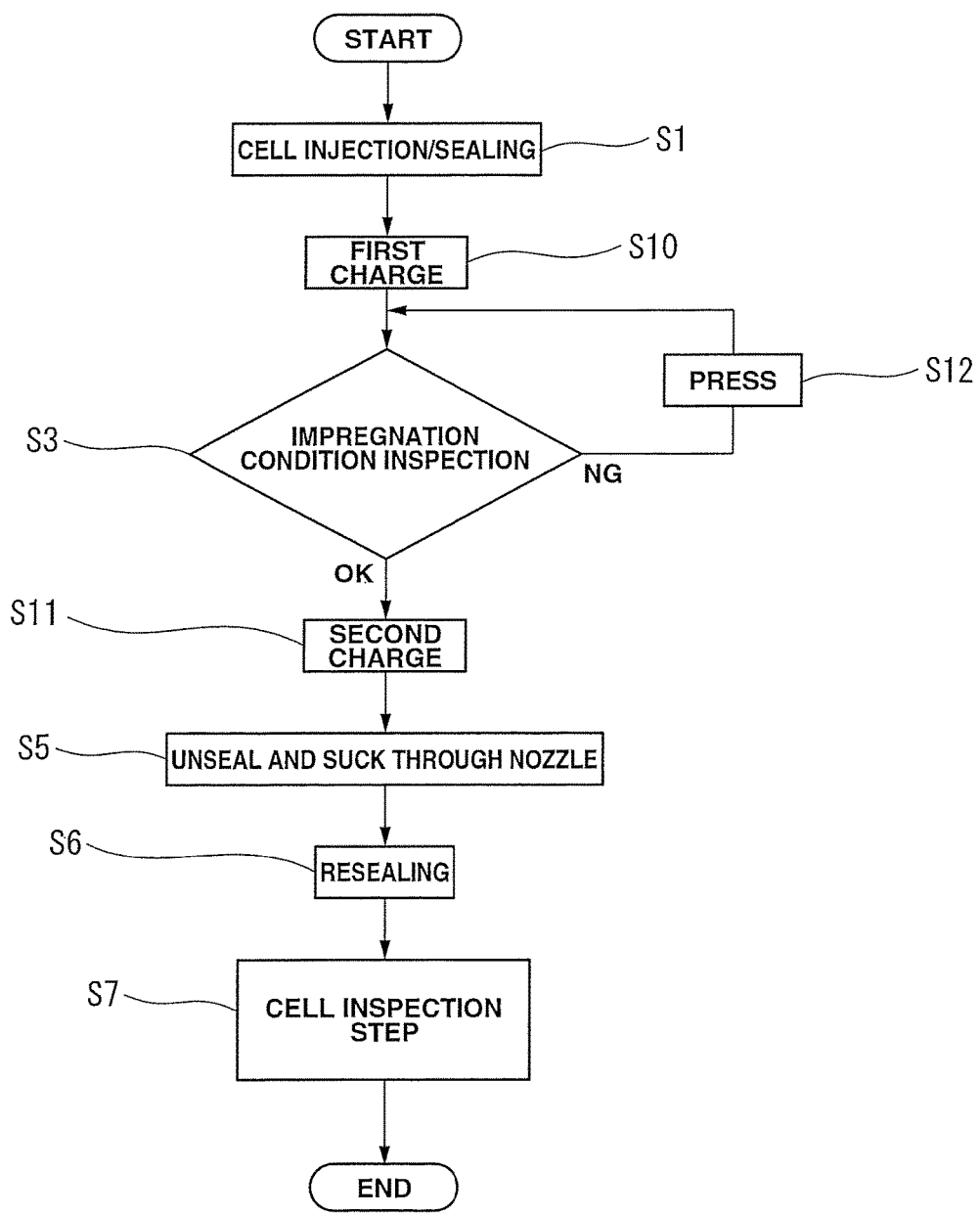

METHOD FOR PRODUCING CELL INCLUDING ELECTROLYTE IMPREGNATION INSPECTION AND PRESSURIZATION

TECHNICAL FIELD

This invention relates to a method for producing a cell.

BACKGROUND ART

In a cell having a structure which houses in an outer case a cell element formed by stacking a positive electrode plate(s), a negative electrode plate(s) and a separator(s) together with an electrolyte solution, it is known that the impregnation condition of electrolyte solution is measured after the electrolyte solution injection (before charging) (e.g. Patent Publication 1). Specifically, a cell after the electrolyte solution injection (before charging) is irradiated with ultrasonic waves, and the electrolyte solution impregnation completion (impregnation condition) is determined based on the transmittance of the ultrasonic waves passing through the cell.

The impregnation condition inspection described in Patent Publication 1 is carried out before charging. However, there also exists a gas that would be newly generated by charging. Some of the bubbles from the gas may remain between electrodes. Since a cell having such faulty impregnation condition continues to flow through a production line until it is detected as a cell property deterioration (too small capacity, etc.) in a cell property inspection process at the final stage, it would become a factor of the production efficiency decline and the manufacturing cost increase.

PRIOR ART PUBLICATIONS

Patent Publications

Patent Publication 1: Japanese Patent Application Publication No. 2010-181290

SUMMARY OF THE INVENTION

It is an object of the present invention to provide a technique that contributes to the production efficiency improvement and the manufacturing cost reduction in the manufacturing technology of a cell.

One embodiment of a method for manufacturing a cell according to the present invention is a method for manufacturing a cell having a cell element formed by stacking a positive electrode plate(s) and a negative electrode plate(s) via a separator(s), and an outer case housing the cell element together with an electrolyte solution. In this method, a cell is formed by housing the cell element and an electrolyte solution in the outer case, and after charging the cell an impregnation condition of the electrolyte solution between the positive electrode plate and the negative electrode plate is inspected. In the present invention, a defect of the electrolyte solution impregnation condition due to gas bubbles formed at least by charging the cell is detected before subsequent steps. With this, it is possible to detect and eliminate defective products in advance to reduce the manufacturing cost.

According to the above invention, it is possible in the cell manufacturing technology to contribute to the production efficiency improvement and the manufacturing cost reduction.

BRIEF DESCRIPTION OF DRAWINGS

FIG. 6 is a flow chart showing the flow of a cell manufacturing method, which is another example of the second embodiment of the present invention.

MODE FOR IMPLEMENTING THE INVENTION

Hereinafter, the embodiments of the present invention will be described.

Figure 1:
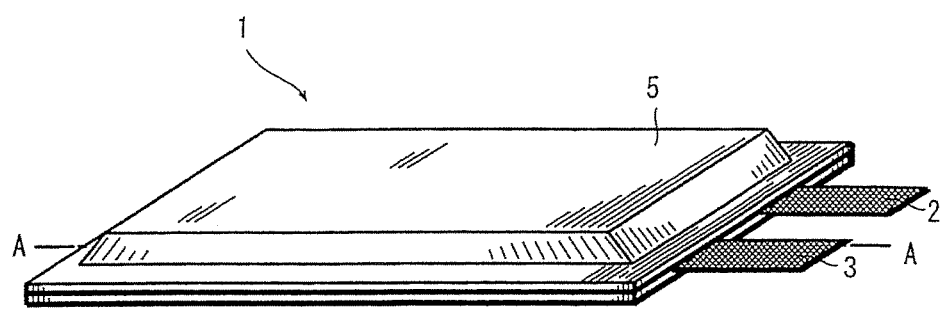
FIG. 1 is a perspective view showing an example of a cell manufactured by applying the present invention.
Figure 2:
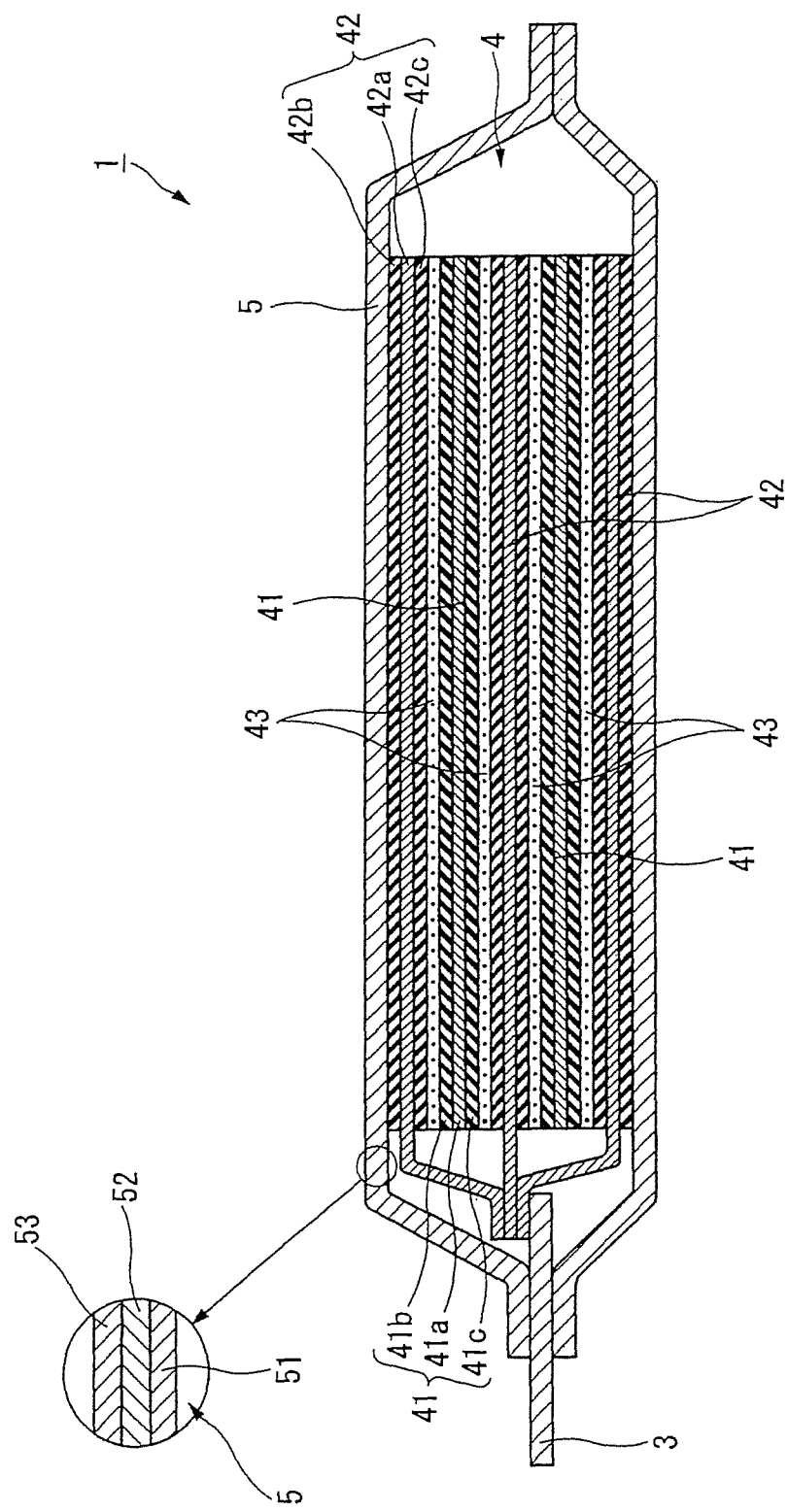
FIG. 2 is an A-A cross sectional view of FIG. 1.

First of all, the structure of the cell manufactured by the manufacturing method according to the present invention will be described. Here, it will be described with an example of a lithium ion battery. FIG. 1 is a perspective view of cell 1, and FIG. 2 is an A-A sectional view of FIG. 1. As shown in FIG. 1, cell 1 has a flat, rectangular parallelepiped external shape, and a pair of terminals 2, 3 is provided to protrude from one edge in the longitudinal direction.

As shown in FIG. 2, cell 1 is prepared by housing, in outer case 5, cell element 4, which is formed by stacking positive electrode plates 41 and negative electrode plates 42 via separators 43, together with an electrolyte solution. More specifically, cell element 4 has three negative electrode plates 42, two positive electrode plates 41, and four separators 43 each of which is sandwiched between negative electrode plate 42 and positive electrode plate 41. That is, in this example, negative electrode plates 42 are located on both sides of cell element 4. However, it is also possible to have a configuration in which a positive electrode plate 41 is placed at the outermost layer of cell element 4. The size of each part in FIGS. 1 and 2 is not necessarily accurate, and it is exaggerated for explanation.

Positive electrode plate 41 is provided by forming positive electrode active material layers 41b, 41c on both sides of a rectangular positive electrode current collector 41a. Positive electrode current collector 41a is formed of an electrochemically stable metal foil, such as aluminum foil, aluminum alloys, copper foil, or nickel foil. Furthermore, positive electrode active material layers 41b, 41c are formed by applying a mixture of a positive electrode active material containing a lithium composite oxide, such as lithium nickel oxide ($LiNiO_2$), lithium manganese oxide ($LiMnO_2$) or lithium cobalt oxide ($LiCoO_2$), and a binder onto a major surface of positive electrode current collector 41a, and by drying and extending the mixture by applying pressure.

Negative electrode plate 42 is provided by forming negative electrode active material layers 42b, 42c on both sides of a rectangular negative electrode current collector 42a. Negative electrode current collector 42a is formed of an electrochemically stable metal foil, such as nickel foil, copper foil, stainless steel foil or iron foil. Negative electrode active material layers 42b, 42c are formed by applying a mixture of a negative electrode active material, which occludes and releases lithium ions of the above-mentioned positive electrode active material, such as amorphous carbon, hardly-graphitized carbon, easily-graphitized carbon or graphite, and a binder to a major surface of negative electrode current collector 42a, and by drying and extending the mixture by applying pressure.

A portion of a longitudinal edge of negative electrode current collector 42a has an extension portion which does not include a negative electrode active material layer, and an end of the extension portion is joined to negative terminal 3. Although not shown in FIG. 2, a portion of a longitudinal edge of positive electrode current collector 41a likewise extends as an extension portion which does not include a positive electrode active material layer, and an end of the extension portion is joined to positive terminal 2.

Separator 43 prevents a short circuit between positive electrode plate 41 and negative electrode plate 42, and holds the electrolyte solution. Separator 43 is a microporous film made of polyolefin, etc., such as polyethylene (PE) and polypropylene (PP). Separator 43 is not limited to a single layer film of polyolefin, etc., but it is also possible to use a three-layer structure that holds a polypropylene film between polyethylene films, and those prepared by laminating a polyolefin microporous membrane, an organic nonwoven fabric, etc.

As the electrolyte solution, it is possible to use an electrolyte generally used in lithium ion secondary batteries, for example, a non-aqueous electrolyte solution formed by dissolving a lithium salt in an organic solvent. As the organic solvent, it is possible to use a single solvent or a combination of at least two solvents, such as polycarbonate, ethylene carbonate, dimethyl ether and diethyl ether. As the lithium salt, it is possible to preferably use a lithium salt that includes fluorine as a constituent element, such as $LiPF_6$, $LiBF_4$, $LiAsF_6$, $LiCF_3SO_3$, $LiC_4F_9SO_3$, $LiN(CF_3SO_2)_2$, $LiC(CF_3SO_2)_3$, etc. It is preferable that the ratio of the amount of the electrolyte solution to the total amount of the pore volumes of electrode plates 41, 42 and separators 43 is 1.1 to 1.7.

Outer case 5 accommodates cell element 4 together with the electrolyte solution. As shown in FIG. 2 as an enlarged view, outer case 5 is, for example, formed by a laminate film having a structure in which one surface (the surface of outer case 5 on the side which accommodates cell element 4) of metal layer 52 (e.g. aluminum layer) is coated with insulating thermal adhesive layer 51 which is thermally adhesive and in which the other surface (the outer surface of outer case 5) is coated with protective layer 53. Thermal adhesive layer 51 is formed by a thermally adhesive synthetic resin, such as polypropylene. Protective layer 53 is formed by a synthetic resin having an excellent durability such as polyethylene terephthalate (PET). The structure of the laminate film is not limited to the structure having synthetic resin layers 51, 53 on the surfaces of metal layer 52, but it may be, for example, a structure equipped with a synthetic resin layer only on the surface of outer case 5 on the side which accommodates cell element 4.

Outer case 5 is formed by a laminate film arranged on one major surface of cell element 4 of FIG. 2 and a laminate film arranged on the other major surface. Outer case 5 is formed by superimposing peripheral four sides of these two laminate films on each other and thermally adhering them to each other. Outer case 5 may also be formed by folding one laminate film into two, arranging cell element 4 inside of the folded film, superimposing peripheral three sides of the laminate film, and thermally adhering them to each other.

As shown in FIG. 1, a pair of terminals 2, 3 located on the short side of cell 1 are drawn to the outside through the bonded surface of outer case 5 when thermally adhering outer case 5. Although the pair of terminals 2, 3 are arranged in parallel with each other on the same edge in FIG. 1, it may have a configuration in which positive terminal 2 is arranged on one edge and negative terminal 3 is arranged on the other edge.

(Method for Producing Cell)

First Embodiment

An example of a method of manufacturing cell 1 according to a first embodiment of the present invention will be described with reference to a flowchart shown in FIG. 3.

First, an electrolyte solution injection step (Step S1) is carried out by accommodating cell element 4 and electrolyte solution in outer case 5 to form cell 1. More specifically, positive electrode plates 41 and negative electrode plates 42 are stacked alternately with an interposal of separator 43 therebetween to form cell element 4, and both sides of cell element 4 are covered with a pair of laminate films. Then, the peripheral edges of three sides of the laminate films are joined to each other by a method such as thermal adhesion. At that time, they are thermally adhered to each other in a condition that portions of the terminals 2, 3 protrude to the outside of the laminate films. Upon this, one side of the laminate films should be left unjoined, and an electrolyte solution is injected into between both laminate films (i.e. the inside of outer case 5) from this unjoined portion. After the electrolyte solution injection, the one side of outer case 5 that is remained unjoined is then joined by a method such as thermal adhesion to seal outer case 5. When joining the last one side, it is preferable to bring the surroundings to a vacuum state.

Next, the charging step (Step S2) is carried out to initially charge cell 1.

Then, the impregnation condition inspection step (Step S3) for inspecting the impregnation condition of the electrolyte solution into cell element 4 is carried out on cell 1 after charging. The inspection of the impregnation condition of an electrolyte solution is conducted by a method using ultrasonic waves (for example, Patent Publication 1), a method of measuring capacitance or impedance between positive electrode plate 41 and negative electrode plate 42, etc. In the inspection of the impregnation condition of the electrolyte solution, the cell that the impregnation condition of the electrolyte solution has been determined as being defective (NG at Step S3) is removed as a defective product (Step S4), and is not subjected to subsequent steps. The cell that the impregnation condition is determined as being defective is, for example, a cell in a condition where gas bubbles generated during charge remain in cell element 4. On the other hand, the cell that the impregnation condition of the electrolyte solution has been determined as being good (OK at Step S3) is subjected to a gas removal step (Step S5) by unsealing a portion of outer case 5 that has been thermally adhered and then sucking the gas in outer case 5 via a nozzle. Then, the unsealed outer case 5 is resealed by a method such as thermal adhesion (Step S6). Cell 1 manufactured in this manner is then subjected to a cell inspection step (Step S7) for inspecting properties (charging/discharging capacity, etc.) of cell 1. Steps S5, S6 may be performed such that a portion of outer case 5 that has been thermally adhered is unsealed and then resealed by a method such as thermal adhesion at the unsealed position or a position inside of the unsealed position under a reduced pressure atmosphere.

According to the present embodiment, a defect product which is defective in the impregnation condition of the electrolyte solution is removed by carrying out the impregnation condition inspection step after performing the electrolyte solution injection step and the charging step, and before the gas removal step. Therefore, since the gas removal step, the step of resealing the laminate films (outer case 5), etc. are not carried out on those products removed, it is possible to achieve the production efficiency improvement and the manufacturing cost reduction.

Second Embodiment

Next, a method of manufacturing a cell according to a second embodiment of the present invention will be described with reference to a flowchart shown in FIG. 4. Since the structure of cell 1 is similar to that of FIGS. 1 and 2, the description will be omitted. In the description of the second embodiment, the same steps as those of the first embodiment are denoted by the same reference numerals, and the detailed descriptions will be omitted.

First, an electrolyte solution injection step (Step S1) is performed, cell element 4 and electrolyte solution are accommodated in outer case 5, and outer case 5 is sealed to form cell 1. When joining the last one side after injecting the electrolyte solution, it is preferable to bring the surroundings to a vacuum state.

Then, the first charging step (Step S10) for charging cell 1 for a predetermined time is performed. In the first charging step, charging is performed such that cell 1 does not reach full charge (primary charge). By "not reach full charge", it is meant that the charging is in a range of, for example, from 1% to 90%, when a full charge is 100%.

Then, the impregnation condition inspection step (Step S3) is performed in accordance with the present invention. The cell that the impregnation condition of the electrolyte solution has been determined as being good at the impregnation condition inspection step is charged (secondary charge) until it reaches full charge at the second charging step (Step S11). After completing the second charging step, a gas removal step (Step S5) is performed to remove gas in outer case 5, and then the unsealed outer case 5 is resealed (Step S6). Cell 1 manufactured in this way is then subjected to a cell inspection step (Step S7) for inspecting cell properties. Steps S5, S6 may be performed such that a portion of outer case 5 that has been thermally adhered is unsealed and then resealed by a method such as thermal adhesion at the unsealed position or a position inside of the unsealed position under a reduced pressure atmosphere.

On the other hand, the cell determined as being defective at the impregnation condition inspection step, for example, a cell determined that gas bubbles generated during charge remain in cell element 4, is removed as a defective product (Step S4).

According to the present embodiment, the impregnation condition inspection step is performed after conducting the primary charge to detect and remove cells that are defective in the impregnation condition of the electrolyte solution. With this, it is possible to reduce the number of cells to be subjected to the secondary charging to have only non-defective products. Accordingly, it is possible to further reduce the manufacturing cost as compared with the cell manufacturing method in accordance with the first embodiment. In the present embodiment, the cells in a good impregnation condition are subjected to the secondary charge. Therefore, it is possible to surely obtain the effect of the secondary charge (a sufficient initial capacity).

Figure 3:
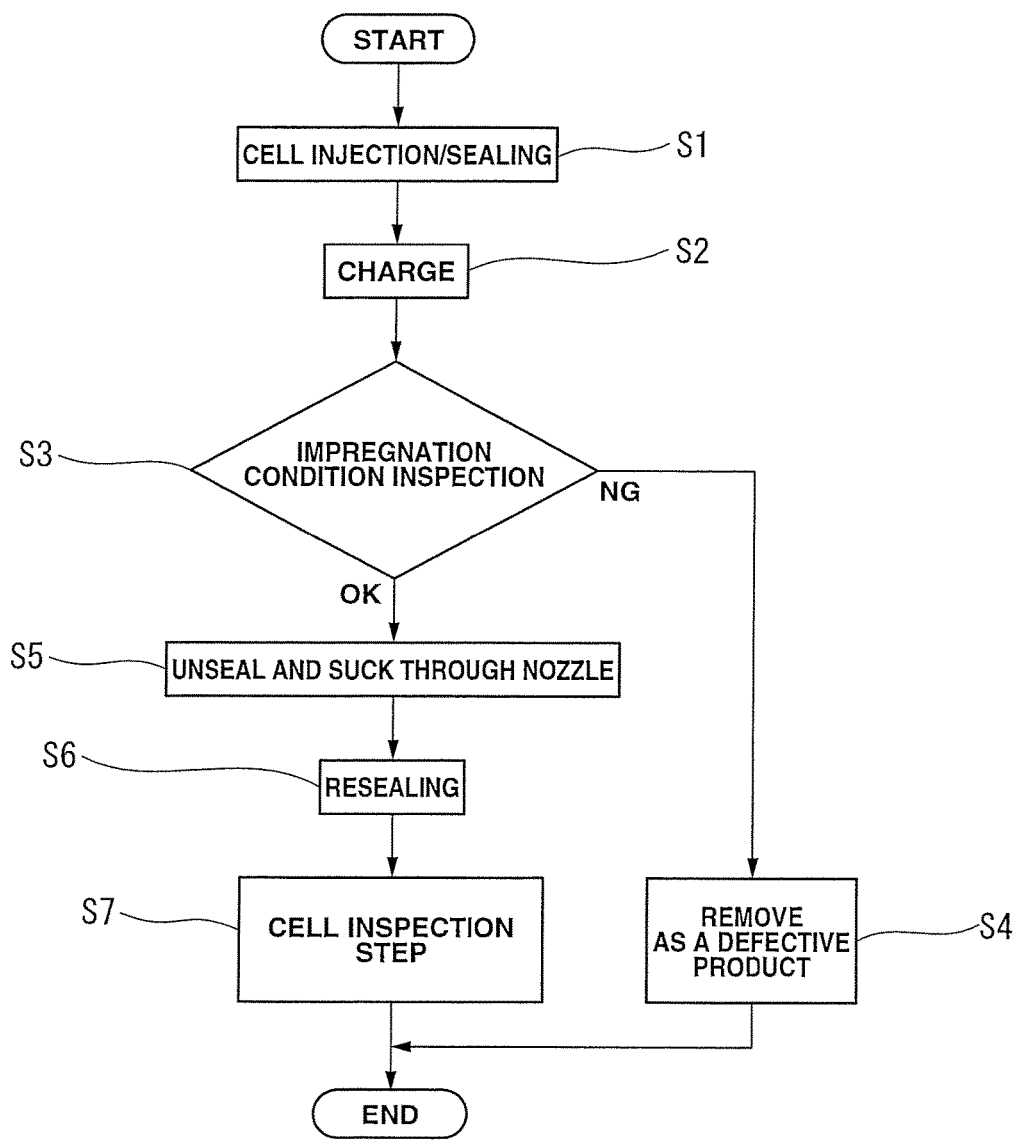
FIG. 3 is a flow chart showing the flow of a cell manufacturing method in accordance with a first embodiment of the present invention.
Figure 4:
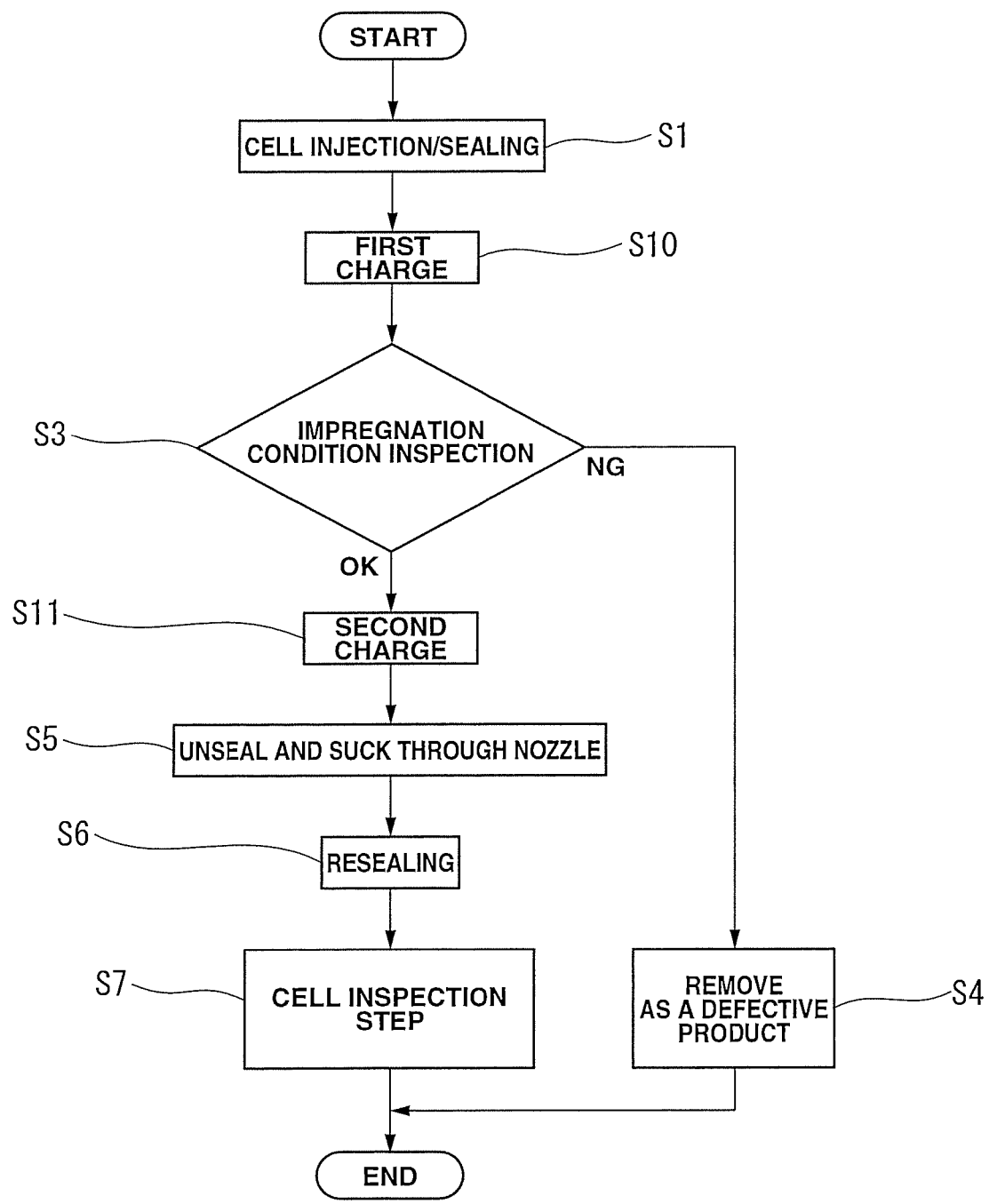
FIG. 4 is a flow chart showing the flow of a cell manufacturing method in accordance with a second embodiment of the present invention.

In order to examine advantages of conducting the impregnation condition inspection halfway through charging, an actual comparison was conducted between a case in which lithium ion cells were respectively prepared by conducting the first charging to have charging rates of 5% and 50% and then the second charging until a charging rate of 100% in the flow of FIG. 4 and a case in which the preparation was conducted by the flow of FIG. 3 (the charging step S2 was conducted until a charging rate of 100%). With this, between them, there was scarcely any difference left in the defect rate in the impregnation condition inspection step. In other words, the result was that a similar impregnation condition defect elimination can be performed either after or before the secondary charging in the flow of FIG. 4. This shows that most of the gas generation occurs in the stage of the first charging (a charging rate of 50% or lower). As a determination of the defect of a condition of the generated gas remaining between the electrodes, it is understood that the impregnation condition inspection at a more efficient timing without dropping the defect determination precision is achieved by the flow in FIG. 4. The charging rate at the first charging step may be around 50% (for example, 30 to 70%). Even if it is set at 5% to 30%, it is possible to conduct the defect determination of the gas generated at an early stage of charging and remaining between the electrodes.

As another embodiment derived from the above, it is optional to conduct a press step by applying pressure on cell element 4 via the laminate films in the stacking direction of electrode plates 41, 42, after completion of the first charging step and before the impregnation condition inspection. It is possible by carrying out the press step to release gas bubbles in cell element 4 to the outside of cell element 4. It is possible to temporarily store the gas bubbles released from cell element 4 by providing a margin of about 1 to 10 mm on at least one side as an internal space between cell element 4 and the thermally adhered part of outer case 5. This stored gas would be released to the outside of the cell at Steps S5, S6. Here, the aforementioned margin is a portion of the laminate films constituting outer case 5, ranging from the end of cell element 4 to the thermally adhered portion of outer case 5. By performing the final sealing under a reduced pressure condition after injecting the electrolyte solution, the laminate films located in this margin are brought into a close contact with each other. Therefore, when the gas has been moved there, the gas can be stored there while separating the films from each other. This makes it possible to have a sufficient gas storing capacity.

As a press method in the press step, it is possible to preferably use a method of applying pressure on the cell with a plate, such as a metal plate or a resin plate, or a method of applying roll pressure on the cell. By conducting the impregnation condition inspection after the press step, it is possible to inspect whether gas bubbles in cell element 4 have been securely released to the outside of cell element 4 by the press.

Third Embodiment

Next, a method of manufacturing a cell in accordance with a third embodiment of the present invention will be described with reference to a flowchart shown in FIG. 5. The description regarding the configuration of cell 1 is omitted because it is similar to that of FIGS. 1 and 2.

Figure 5:
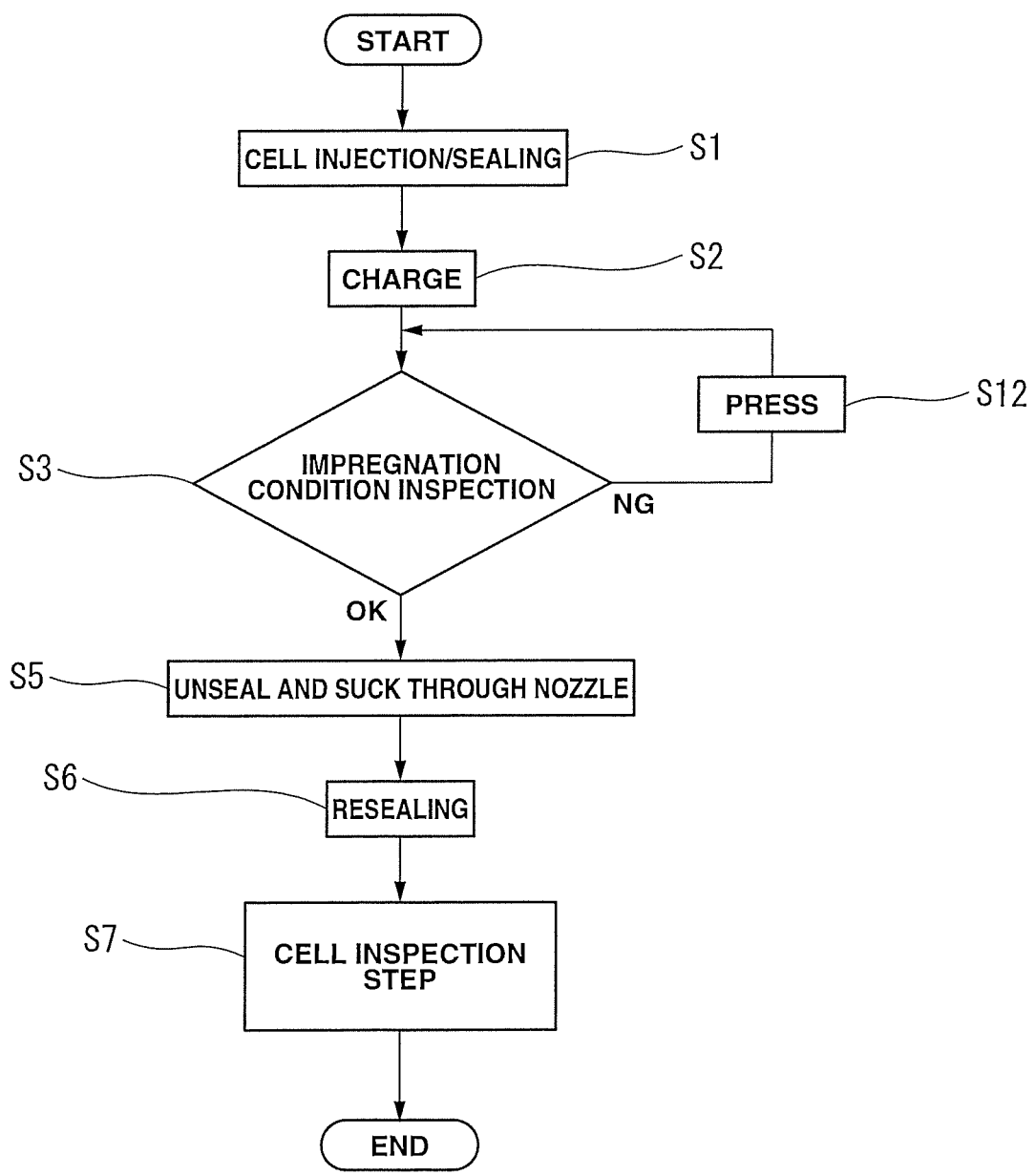
FIG. 5 is a flow chart showing the flow of a cell manufacturing method in accordance with a third embodiment of the present invention.

As shown in FIG. 5, if the impregnation condition of the electrolyte solution is determined to be defective in the impregnation condition inspection step (NG at Step S3), a regeneration step (Step S12) is carried out by applying pressure on cell element 4 of cell 1 in the stacking direction of electrode plates 41, 42 that was determined to have a poor impregnation condition of the electrolyte solution. By carrying out the regeneration step, it is possible to release gas bubbles in cell element 4 to the outside of cell element 4. Then, cell 1 after conducting the regeneration step is once again subjected to the impregnation condition inspection step (Step S3). If the impregnation condition is determined to be good in this impregnation condition inspection step (OK at Step 3), the gas removal step (Step S5) is performed to remove the gas in outer case 5. Then, the unsealed outer case 5 is resealed (Step S6). Cell 1 manufactured in this manner is then subjected to a cell inspection step (Step S7) for inspecting cell properties. If the impregnation condition of the electrolyte solution of cell 1 that was once again subjected to the impregnation condition inspection step is determined to be defective, the cell is once again subjected to the regeneration step or is removed as a defective product.

According to the present embodiment, the impregnation condition inspection step is conducted after performing the electrolyte solution injection step and the charging step and before the gas removal step. With this, it is possible to achieve the production efficiency improvement and the manufacturing cost reduction, similar to the first embodiment.

By subjecting a cell determined to be in a poor impregnation condition at the impregnation condition inspection step to the regeneration step, it is possible to conduct a repair so that the impregnation condition becomes good. As a result, since the number of cells judged to be defective is reduced, the yield of cell manufacture can be improved. Even if a cell is judged to be in a poor impregnation condition at the impregnation condition inspection step, once the cell is determined to be in a good impregnation condition after going through the regeneration step and the impregnation condition inspection step, gas bubbles in cell element 4 are securely released to the outside of cell element 4. Thus, gas bubbles are surely removed at the gas removal step as well as other acceptable products. Furthermore, since the same steps are carried out after the impregnation inspection step to produce cells, no difference is found in quality (repair is possible). Furthermore, if the impregnation condition of an electrolyte solution is inspected after the gas removal step similar to conventional cell manufacturing methods, it is possible to judge the impregnation condition as being no good by confirming the presence of gas between the electrode plates. It is, however, not possible to conduct a step of removing the gas once again. Therefore, the cell determined to be in a poor impregnation condition had to be discarded. In contrast with this, according to the present embodiment, it is possible to improve the yield by conducting a regeneration step to repair the cell judged as being in a poor impregnation condition.

Furthermore, if the impregnation condition immediately after the electrolyte solution injection is defective, it is possible to turn the impregnation condition into a good condition by performing aging (controlling the impregnation time) to promote impregnation. In some cases, however, it is not possible to remove a gas generated by charging of cell 1 even by standing still. That is, with respect to the defects in impregnation condition of electrolyte solution, the task is different between a poor impregnation condition immediately after injecting electrolyte solution and a poor impregnation condition after charging. Furthermore, in conventional cell manufacturing methods, there has been no idea about a treatment of a product determined to be defective after judging the impregnation condition of electrolyte solution, particularly about applying an additional step to pass the acceptance level. In contrast with this, according to the present embodiment, it is possible to repair and use cell 1 discarded in the past by conducting the regeneration step to repair cell 1 determined to be in a poor impregnation condition after charging cell 1. Therefore, it is possible to achieve a further improvement in production efficiency and a further reduction in manufacturing cost.

As mentioned above, the cell manufacturing method in accordance with the present invention has been described in detail by showing specific examples. The cell manufacturing method in accordance with the present invention is, however, not limited to the foregoing embodiments. It is possible to appropriately change the design within a range that does not impair the features of the present invention.

For example, in the embodiments, the lithium ion cell formed by stacking positive electrode plates and negative electrode plates was illustrated and described. The cell structure is, however, not limited to the embodiments. It can also be applied to a wound type lithium ion cell and other secondary batteries.

Furthermore, for example, the second charging step in the second embodiment is not limited to performing up to a full charge. It may be 50%, 70%, 90%, etc.

Furthermore, the features of each embodiment are the inventions having significant effects independently. Therefore, it is possible to obtain a partial effect or combined effect by partially carrying out a step that characterizes each embodiment or by carrying out them in combination. For example, as shown in FIG. 6, it is possible to achieve the effect of the second embodiment and the effect of the third embodiment by incorporating the regeneration step of the cell manufacturing method according to the third embodiment into the cell manufacturing method according to the second embodiment.

The invention claimed is:

1. A method for manufacturing a cell having a cell element formed by stacking a positive electrode plate and a negative electrode plate with an interposal of a separator therebetween, and an outer case housing the cell element together with an electrolyte solution, the method comprising the steps of:
   forming the cell by housing the cell element and the electrolyte solution within the outer case;
   conducting a first charging to charge the cell to less than a full charge;
   applying a pressure on the cell element of the cell in a stacking direction of the cell element after the first charging,
   inspecting an impregnation condition of the electrolyte solution between the positive electrode plate and the negative electrode plate after the step of applying the pressure on the cell element of the cell; and
   conducting a second charging to further charge the cell.

2. The cell manufacturing method of claim 1, further comprising a step of removing a gas within the outer case after the second charging.

3. The cell manufacturing method of claim 1,
   wherein when the cell is found to be defective in the step of inspecting the impregnation condition of the electrolyte solution, the method further comprises the steps of:
      reapplying the pressure on the cell element; and
      reinspecting the impregnation condition of the electrolyte solution in the cell, and
   wherein the second charging is carried out
      when the cell is determined to be non-defective in the inspecting step of inspecting the impregnation condition of the electrolyte solution that is carried out after the first charging, or when the cell is determined to be non-defective in the step of reinspecting the impregnation condition of the electrolyte solution.

4. The cell manufacturing method of claim 1, wherein the step of applying the pressure on the cell element of the cell is conducted with a plate or by applying a roll pressure thereon, thereby releasing gas bubbles in the cell element to an outside of the cell element.

5. A method for manufacturing a cell having a cell element formed by stacking a positive electrode plate and a negative electrode plate with an interposal of a separator therebetween, and an outer case housing the cell element together with an electrolyte solution, the method comprising the steps of:

forming the cell by housing the cell element and the electrolyte solution within the outer case;

charging the cell;

inspecting an impregnation condition of the electrolyte solution between the positive electrode plate and the negative electrode plate after the charging; and when the cell is found to be defective in the step of inspecting the impregnation condition of the electrolyte solution, applying a pressure on the cell element of the cell in a stacking direction of the cell element, and reinspecting the impregnation condition of the electrolyte solution in the cell after applying the pressure on the cell element.

6. The cell manufacturing method of claim 5, further comprising a step of removing a gas within the outer case when the cell is determined to be non-defective in the step of inspecting the impregnation condition of the electrolyte solution that is carried out after the step of charging the cell, or when the cell which is initially determined to be defective in the step of inspecting the impregnation condition of the electrolyte solution is later determined to be non-defective in the step of reinspecting the impregnation condition of the electrolyte solution.

7. The cell manufacturing method of claim 5, wherein the step of applying the pressure on the cell element of the cell is conducted with a plate or by applying a roll pressure thereon, thereby releasing gas bubbles in the cell element to an outside of the cell element.

8. A method for manufacturing a cell having a cell element formed by stacking a positive electrode plate and a negative electrode plate with an interposal of a separator therebetween, and an outer case housing the cell element together with an electrolyte solution, the method comprising the steps of:

forming the cell by housing the cell element and the electrolyte solution within the outer case;

conducting a first charging to charge the cell to less than a full charge;

inspecting an impregnation condition of the electrolyte solution between the positive electrode plate and the negative electrode plate after the first charging;

when the cell is found to be defective in the step of inspecting the impregnation condition of the electrolyte solution, applying a pressure on the cell element of the cell in a stacking direction of the cell element, and reinspecting the impregnation condition of the electrolyte solution in the cell after applying the pressure on the cell element; and conducting a second charging to further charge the cell when the cell is determined to be non-defective in the step of inspecting the impregnation condition of the electrolyte solution that is carried out after the first charging, or the cell which is initially determined to be defective in the step of inspecting the impregnation condition of the electrolyte solution, is later determined to be non-defective in the step of reinspecting the impregnation condition of the electrolyte solution.

9. The cell manufacturing method of claim 8, further comprising a step of removing a gas within the outer case after the second charging.

10. The cell manufacturing method of claim 8, wherein the step of applying the pressure on the cell element of the cell is conducted with a plate or by applying a roll pressure thereon, thereby releasing gas bubbles in the cell element to an outside of the cell element.

* * * * *